(12) United States Patent
McCandless (10) Patent No.: US 7,809,999 B2
(45) Date of Patent: Oct. 5, 2010

(54) TERNARY SEARCH PROCESS

(75) Inventor: William McCandless, Carlisle, MA (US)

(73) Assignee: Teradyne, Inc., North Reading, MA (US)

( * ) Notice: Subject to any disclaimer, the term of this patent is extended or adjusted under 35 U.S.C. 154(b) by 685 days.

(21) Appl. No.: 11/184,482

(22) Filed: Jul. 19, 2005

(65) Prior Publication Data

US 2007/0019719 A1    Jan. 25, 2007

(51) Int. Cl.
*G01R 31/28* (2006.01)
(52) U.S. Cl. ..................................... 714/724
(58) Field of Classification Search .................. 714/724
See application file for complete search history.

(56) References Cited

U.S. PATENT DOCUMENTS

| | | | | |
|---|---|---|---|---|
| 5,214,319 A | * | 5/1993 | Abdi | 327/58 |
| 5,373,400 A | * | 12/1994 | Kovacs | 360/46 |
| 5,933,459 A | * | 8/1999 | Saunders et al. | 375/317 |
| 6,438,184 B1 | | 8/2002 | Nayler | |

FOREIGN PATENT DOCUMENTS

WO    WO2007011452    1/2007

OTHER PUBLICATIONS

International Search Report for Application No. PCT/US2006/20006.
Written Opinion for Application No. PCT/US2006/20006.
Letter dated Feb. 23, 2010 from foreign associate regarding office action in corresponding Chinese Patent Application No. 200680026387.1 mailed Jan. 22, 2010, 2 pages.
Office Action in office action in corresponding Chinese Patent Application No. 200680026387.1 mailed Jan. 22, 2010 (both English and Chinese versions), 8 pages.
Flash ADC: Digital-Analog Conversion, http://www.allaboutcircuits.com/vol_4/chpt_13/4.html, downloaded May 17, 2010, 3 pages.
Successive approximation ADC: Digital-Analog Conversion, http://www.allaboutcircuits.com/vol_4/chpt_13/6.html, downloaded May 17, 2010, 2 pages.
Response to office action in corresponding Chinese Patent Application No. 200680026387.1 mailed Jun. 7, 2010, 14 pages [including associate letter, amended claim set, and English summary].

* cited by examiner

*Primary Examiner*—James C Kerveros
(74) *Attorney, Agent, or Firm*—Fish & Richardson P.C.

(57) ABSTRACT

An apparatus for use in obtaining a value from a device includes a first comparator to receive a reference high signal and a device signal, where the first comparator provides a first output signal to indicate whether the device signal is above or below the reference high signal, and a second comparator to receive a reference low signal and the device signal, where the second comparator provides a second output signal to indicate whether the device signal is above or below the reference low signal. Also included in the apparatus is circuitry (i) to adjust at least one of the reference high signal and the reference low signal based on the first output signal and the second output signal, and (ii) to output the value if a difference between the reference high signal and the reference low signal meets a predetermined criterion, the value being based on the difference.

23 Claims, 7 Drawing Sheets

| Voh | Desired |
|---|---|
| 2.5 | 2.718282 |
| 3.7505 | 2.718282 |
| 3.12525 | 2.718282 |
| 2.812625 | 2.718282 |
| 2.656313 | 2.718282 |
| 2.734469 | 2.718282 |
| 2.695391 | 2.718282 |
| 2.71493 | 2.718282 |
| 2.724699 | 2.718282 |
| 2.719814 | 2.718282 |
| 2.717372 | 2.718282 |

FIG. 5

Note that it takes 8 tests using the Binary search, but only 5 tests using the Ternary search.

| Vol | Voh | Desired |
|---|---|---|
| 1.666667 | 3.333333 | 2.718282 |
| 2.222556 | 2.777444 | 2.718282 |
| 2.407852 | 2.592148 | 2.718282 |
| 2.654247 | 2.715346 | 2.718282 |
| 2.736379 | 2.756412 | 2.718282 |
| 2.72269 | 2.729034 | 2.718282 |
| 2.718127 | 2.719909 | 2.718282 |

Note that it takes 11 tests for the Binary search, and 8 tests for the combined Binary plus Ternary.

| Vol | Voh | Desired |
|---|---|---|
| 1.666667 | 3.333333 | 2.718282 |
| 2.225556 | 2.774444 | 2.718282 |
| 2.411852 | 2.588148 | 2.718282 |
| 2.65358 | 2.709012 | 2.718282 |

FIG. 8

TERNARY SEARCH PROCESS

TECHNICAL FIELD

This patent application relates generally to a process for obtaining a signal value and, more particularly, to a process that uses ternary searching to obtain the signal value.

BACKGROUND

Automatic test equipment (ATE) is typically an automated, usually computer-driven, apparatus for testing devices, such as semiconductors, electronic circuits, and printed circuit board assemblies. One function of ATE is to capture signals from device pins.

More specifically, ATE receives signals from pins on a device under test (DUT). Circuitry in the ATE is used to obtain voltage values of those signals at points in time, and to reconstruct a waveform based on those values. Existing processes for obtaining such voltage values, referred to herein as "search processes", can require a large number of iterations before an actual voltage value is obtained. The more iterations that are required, the slower the ATE becomes. Furthermore, large numbers of iterations take up valuable processing resources that could be allocated to other tasks.

SUMMARY

This application describes apparatus and methods, including computer program products, for obtaining a device signal value using a ternary search process.

In general, in one aspect, the invention is directed to an apparatus for use in obtaining a value from a device. In this aspect, the apparatus includes a first comparator to receive a reference high signal and a device signal, where the first comparator provides a first output signal to indicate whether the device signal is above or below the reference high signal, and a second comparator to receive a reference low signal and the device signal, where the second comparator provides a second output signal to indicate whether the device signal is above or below the reference low signal. Also included in the apparatus is circuitry (i) to adjust at least one of the reference high signal and the reference low signal based on the first output signal and the second output signal, and (ii) to output the value if a difference between the reference high signal and the reference low signal meets a predetermined criterion, the value being based on the difference.

The foregoing aspect may also include one or more of the following features.

The circuitry may be configured to determine, based on the first output signal and the second output signal, whether the device signal is above the reference high signal, below the reference low signal, or between the reference high signal and the reference low signal. The reference high signal may be at a set voltage level and, if the device signal is above the reference high signal, the circuitry may adjust the reference low signal so that the reference low signal is at the set voltage level and so that the reference high signal exceeds the set voltage level. The reference low signal may be at a set voltage level and, if the device signal is below the reference low signal, the circuitry may adjust the reference high signal so that the reference high signal is at the set voltage level and so that the reference low signal is below the set voltage level. The reference high signal may be at a first set voltage and the reference low signal is at a second set voltage and, if the device signal is between the reference high signal and the reference low signal, the circuitry may adjust the reference high signal or the reference low signal to be between the first set voltage and the second set voltage.

If the value is not output, and after the reference high signal and/or the reference low signal are adjusted, the first comparator may receive the reference high signal and the device signal and provide a third output signal to indicate whether the device signal is above or below the reference high signal, and the second comparator may receive the reference low signal and the device signal and provide a fourth output signal to indicate whether the device signal is above or below the reference low signal. The circuitry may adjust at least one of the reference high signal and the reference low signal based on the third output signal and the fourth output signal, and may output the value if a difference between the reference high signal and the reference low signal meets the predetermined criterion.

The circuitry may be configured to determine if the difference is below a predetermined threshold and, if the difference is below the predetermined threshold, the circuitry may deactivate the first comparator or the second comparator. The deactivated comparator may be configured to receive a reference signal and the device signal, and the deactivated comparator may provide a third output signal to indicate whether the device signal is above or below the reference signal. The circuitry may be configured to adjust the reference signal based on the third output signal, and to output the value if a difference between the reference high signal and a previous reference signal meets the predetermined criterion, the value being based on the difference.

In general, in another aspect, the invention is directed to a method for obtaining a value from a device signal. The method includes performing a ternary search process in an attempt to obtain the value from the device signal, where the ternary search process comprises comparing the device signal to both a reference high signal and a reference low signal, and repeating the ternary search process. Each time the ternary search process is repeated, the ternary search process gets closer to obtaining the value.

The foregoing aspect may also include one or more of the following features.

Performing the ternary search process may include comparing the device signal to the reference high signal, comparing the device signal to a reference low signal, and determining whether a difference between the reference high signal and the reference low signal meets a predetermined criterion. If the difference meets the predetermined criterion, the ternary search process may further include outputting the value, where the value is based on the difference. If the difference does not meet the predetermined criterion, the ternary search process may further include determining whether the device signal is above the reference high signal, between the reference high signal and the reference low signal, or below the reference low signal, and adjusting at least one of the reference high signal and the reference low signal based on whether the device signal is above the reference high signal, between the reference high signal and the reference low signal, or below the reference low signal. If the device signal is above the reference high signal, the reference low signal may adjusted so that the reference low signal is at a set voltage level and so that the reference high signal exceeds the set voltage level. If the device signal is below the reference low signal, the reference high signal may be adjusted so that the reference high signal is at the set voltage level and so that the reference low signal is below the set voltage level. If the device signal is between the reference high signal and the reference low signal, the reference high signal or the reference low signal may be adjusted to be between the first set voltage and the second set voltage.

The ternary search process may be repeated until a difference between the reference high signal and the reference low signal is less than a predetermined threshold. Thereafter, the method may include performing a binary search process until the value is obtained. The binary search process may include comparing the device signal to a reference signal, determining whether the device signal is above or below the reference high signal, and adjusting the reference signal based on whether the device signal is above or below the reference signal. The ternary search process may be repeated until the value is obtained.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
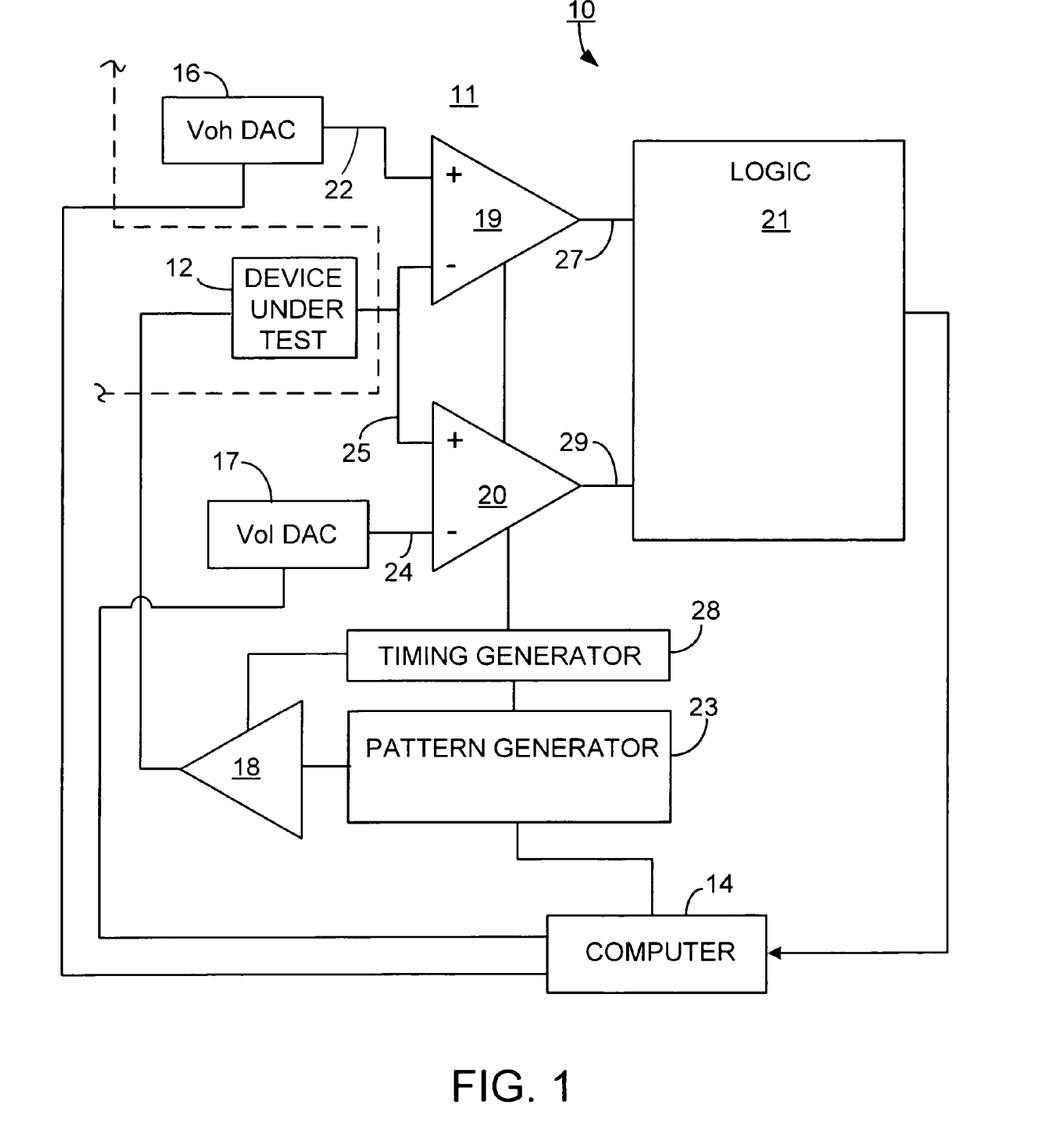
FIG. 1 is a block diagram of circuitry included in an ATE that may be used in performing a ternary search process.

FIG. 1 is a block diagram of circuitry 10 in an ATE 11 for testing a DUT 12. Circuitry 10 is for use in obtaining voltage values (or simply, "values") based on signals from pins on DUT 12. Briefly, DUT 12 outputs a voltage signal to ATE 11. ATE 11 receives the voltage signal and, using circuitry 10, obtains a value from the signal. Multiple values may be obtained using circuitry 10. These multiple values may be used to construct a waveform output of DUT 12, as described below.

As shown in FIG. 1, ATE 11 includes a computer 14, digital-to-analog converters (DACs) 16 and 17, comparators 19 and 20, and logic 21. Computer 14 may be any type of processing device that is capable of running software to control various ATE functions. One of the functions controlled by computer 14 is instructing DAC 16 to generate a reference-high voltage signal ($V_{oh}$) and instructing DAC 17 to generate a reference-low voltage signal ($V_{ol}$). $V_{oh}$ and $V_{ol}$ are analog signals in this implementation.

Comparators 19, 20 receive two input signals and generate an output signal based on those input signals. Each comparator rapidly compares two input values, and converts the result to a digital signal. This digital signal indicates when the input is more positive than the negative input at a specified time. Each comparator compares two voltages and changes output voltage states when one input exceeds the other in magnitude. Other circuits and/or software may be used instead of, or in addition to, strobed comparators to implement comparators 19 and 20.

Comparators 19 and 20 receive the $V_{oh}$ and $V_{ol}$ voltages, respectively. Comparators 19 and 20 also receive a DUT signal 25, which is output from a pin on DUT 12. A pattern generator 23 may be used to apply signals to DUT 12, which result in output at the DUT pins, including DUT signal 25. Timing generator 28 controls output of the signals through a driver 18, and the time at which comparators 19, 20 observe the device output. In one implementation, the pattern generator may include a vector table, which is used to apply pattern bursts to the DUT during testing.

The (+) input of comparator 19 receives $V_{oh}$, the (−) input of comparator 19 receives DUT signal 25, the (+) input of comparator 20 receives DUT signal 25, and the (−) input of comparator 20 receives $V_{ol}$. As explained below, comparator 19 outputs signals indicating whether DUT signal 25 is above or below $V_{oh}$. For example, comparator 19 may output a high voltage signal to indicate that DUT signal 25 is above $V_{oh}$, and may output a low voltage signal to indicate that DUT signal is below $V_{oh}$. Comparator 20 outputs similar signals indicating whether DUT signal 25 is above or below $V_{ol}$. Logic 21 determines, based on the output signals of comparators 19 and 20, whether DUT signal 25 is higher than $V_{oh}$, lower than $V_{ol}$, or between $V_{oh}$ and $V_{ol}$.

Logic 21 may be any type of device including, but not limited to, programmable logic such as an ASIC (Application Specific Integrated Circuit), FPGA (field programmable gate logic), a microprocessor, a digital signal processor (DSP), a microcontroller, discrete logic, or any combination thereof. Logic 21 receives output signals 27, 29 from comparators 19, 20 and uses these output signals to determine where DUT signal 25 falls relative to $V_{oh}$ and $V_{ol}$. Logic 21 uses this determination to instruct computer 14 to adjust the values of $V_{oh}$ and $V_{ol}$ and, if necessary, to repeat the comparison to DUT signal 25 until a value of DUT signal 25 is obtained. This process is described in more detail below.

Figure 2:
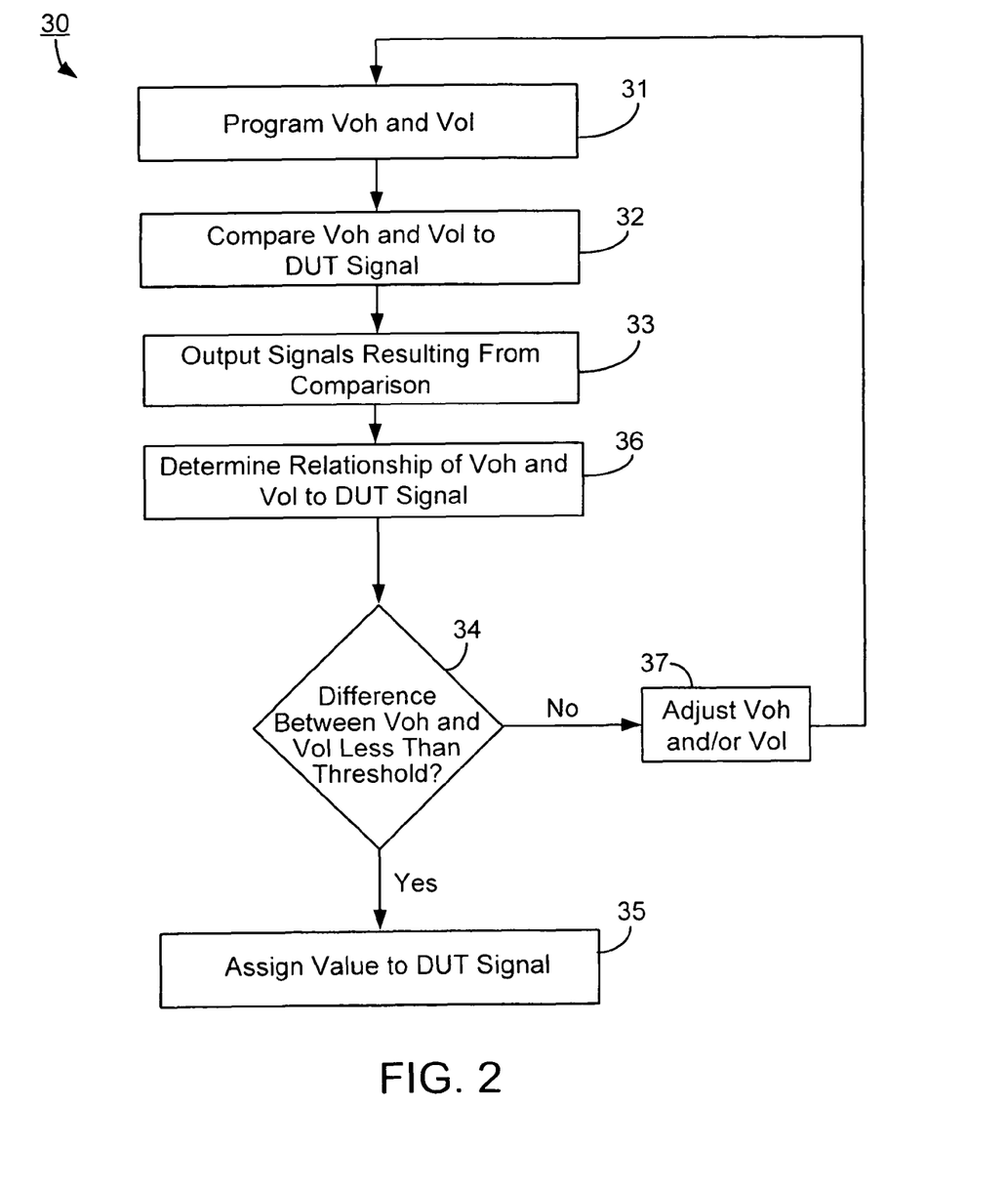
FIG. 2 is a flowchart showing a ternary search process.

FIG. 2 is a flowchart showing a ternary search process 30, which may be performed by circuitry 10, to obtain a value for DUT signal 25. Process 30 instructs $V_{oh}$ DAC 16 to generate an analog reference-high voltage signal, namely $V_{oh}$, and instructs $V_{ol}$ DAC 17 to generate an analog reference-low signal, namely $V_{ol}$. Computer 14 may be used to program (31) $V_{oh}$ DAC 16 and $V_{oh}$ DAC 17 appropriately.

Process 30 compares (32) the $V_{oh}$ and $V_{ol}$ signals to DUT signal 25. In circuitry 10, comparison is performed using comparators 19 and 20. Comparator 19 compares (32) DUT signal 25 to $V_{oh}$. When $V_{oh}$ is higher than DUT signal 25, comparator 19 outputs (33) a high voltage signal, and when $V_{oh}$ is lower than DUT signal 25, comparator 19 outputs (33) a low voltage signal. Comparator 20 compares (32) DUT signal 25 to $V_{ol}$. When $V_{ol}$ is higher than DUT signal 25, comparator 20 outputs (33) a low voltage signal, and when $V_{ol}$ is lower than DUT signal 25, comparator 20 outputs (33) a high voltage signal. It is noted that the outputs of the comparators may be designated to indicate any condition, and that the designations associated with the high and low output signals described here are provided only to give an example of how circuitry 10 may operate.

Logic 21 receives output signals 27 and 29 from comparators 19 and 20, respectively. Logic 21 determines (36), based on the comparator output signals, where DUT signal 25 falls relative to $V_{oh}$ and $V_{ol}$. Specifically, logic 21 determines whether DUT signal 25 is above $V_{oh}$, between $V_{oh}$ and $V_{ol}$, or below $V_{ol}$. Logic 21 outputs a signal indicating where DUT signal 25 falls relative to $V_{oh}$ and $V_{ol}$ to computer 14.

Computer 14 determines (34) whether the difference between $V_{oh}$ and $V_{ol}$ is less than a predetermined threshold. This is done for the following reason. Ternary search process 30 is used to identify a value from DUT signal 25. This value is detected by comparing DUT signal 25 to $V_{oh}$ and $V_{ol}$ one or more times. Each time there is a comparison, the values of $V_{oh}$ and $V_{ol}$ may change. That is, the values converge. When the difference between $V_{oh}$ and $V_{ol}$ is less than a predetermined threshold, the value of DUT signal 25 is deemed obtained—the actual value may be obtained, e.g., by averaging $V_{oh}$ and $V_{ol}$ after the threshold is reached. The predetermined threshold thus reflects a resolution of circuitry 10, and may be programmed to any value. In this implementation, the threshold is one millivolt (1 mV); however, other thresholds may be used. Circuitry 10 thus is used detect a value of DUT signal 25 to the order of millivolts.

In FIG. 2, if the difference between $V_{oh}$ and $V_{ol}$ is less than the predetermined threshold, computer 14 assigns (35) a value to DUT signal 25. The value may be $V_{oh}$, $V_{ol}$, or some value between $V_{oh}$ and $V_{ol}$, e.g., the average of $V_{oh}$ and $V_{ol}$. Thereafter, process 30 may be used to obtain the value of another DUT signal. That is, process 30 may be repeated for numerous DUT signals, and the resulting obtained values may be arranged chronologically and interpolated, if desired, to obtain a waveform output of a DUT pin.

In FIG. 2, if the difference between $V_{oh}$ and $V_{ol}$ is greater than the predetermined threshold, process 30 is repeated for DUT signal 25 (since the resolution of circuitry 10 has not been achieved). For a next pass through process 30 for DUT signal 25, computer 14 adjusts (37) $V_{oh}$ and/or $V_{ol}$ based on where DUT signal 25 fell relative to $V_{oh}$ and/or $V_{ol}$ in the previous pass. More specifically, if DUT signal 25 is higher than $V_{oh}$, computer 14 programs $V_{ol}$ DAC 17 to output a $V_{ol}'$ voltage that is equal to the previous $V_{oh}$ voltage. Computer 14 also programs (31) $V_{oh}$ DAC 16 to output a $V_{oh}'$ voltage that exceeds the new $V_{ol}'$ voltage by a specified amount. The specified amount may defined by computer 14.

If DUT signal 25 is lower than $V_{ol}$, computer 14 programs (31) $V_{oh}$ DAC 16 to output a $V_{oh}'$ voltage that is equal to the previous $V_{ol}$ voltage. Computer 14 also programs (31) $V_{ol}$ DAC 17 to output a $V_{ol}'$ voltage that is below the new $V_{ol}'$ voltage by a specified amount. As was the case above, the specified amount may be defined by computer 14.

If DUT signal 25 is between $V_{ol}$ and $V_{oh}$, computer 14 programs $V_{oh}$ DAC 16, $V_{o}$ DAC 17, or both to output different $V_{oh}$ and/or $V_{ol}$ voltages. As was the case above, this is done in order to reduce the difference between $V_{ol}$ and $V_{oh}$. However, since DUT signal 25 is between $V_{ol}$ and $V_{oh}$, either $V_{ol}$ or $V_{oh}$ may be adjusted. For example, $V_{oh}'$ may be set so that it is one-third way, or some other distance between, previous $V_{oh}$ and $V_{ol}$ voltages. In this case $V_{ol}$ may be unchanged. Alternatively, $V_{ol}'$ may be set so that it is one-third way, or some other distance between, previous $V_{oh}$ and $V_{ol}$ voltages. In this case $V_{oh}$ may be unchanged. In still another alternative arrangement, both $V_{oh}'$ and $V_{ol}'$ may be set so that there is less of a difference between them than between previous $V_{oh}$ and $V_{ol}$ voltages.

Once $V_{oh}$ DAC 16 and/or $V_{ol}$ DAC 17 have been reprogrammed in the manner described above, process 30 is repeated for DUT signal 25 using the adjusted voltage(s). Process 30 is repeated until a value is assigned to DUT signal 25.

Instead of implementing process 30 using circuitry 10, process 30 may be implemented in software. An example of a machine-executable computer code to implement process 30 is shown in attached Appendix A.

Figure 3:
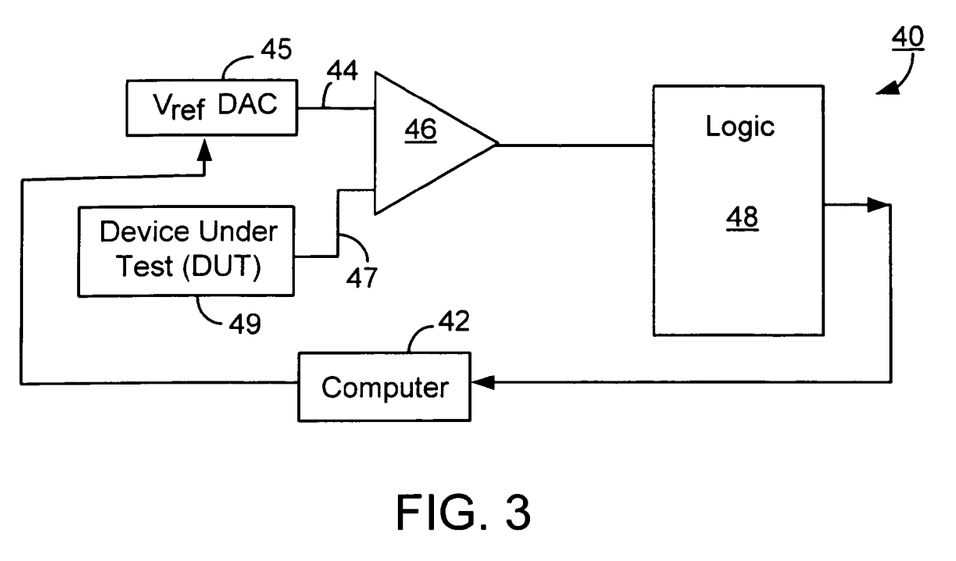
FIG. 3 is a block diagram of circuitry included in an ATE that may be used in performing a binary search process.

The ternary search process described herein has advantages over binary search processes, such as that described below. FIG. 3 shows circuitry 40 that may be used to perform a binary search process. In this example, circuitry 40 uses a computer 42 to program a DAC 45 to output a reference voltage, $V_{ref}$. $V_{ref}$ is applied to one input of a comparator 46. The other input of comparator 46 receives a DUT signal 47, which is output from a pin on the DUT.

Figure 4:
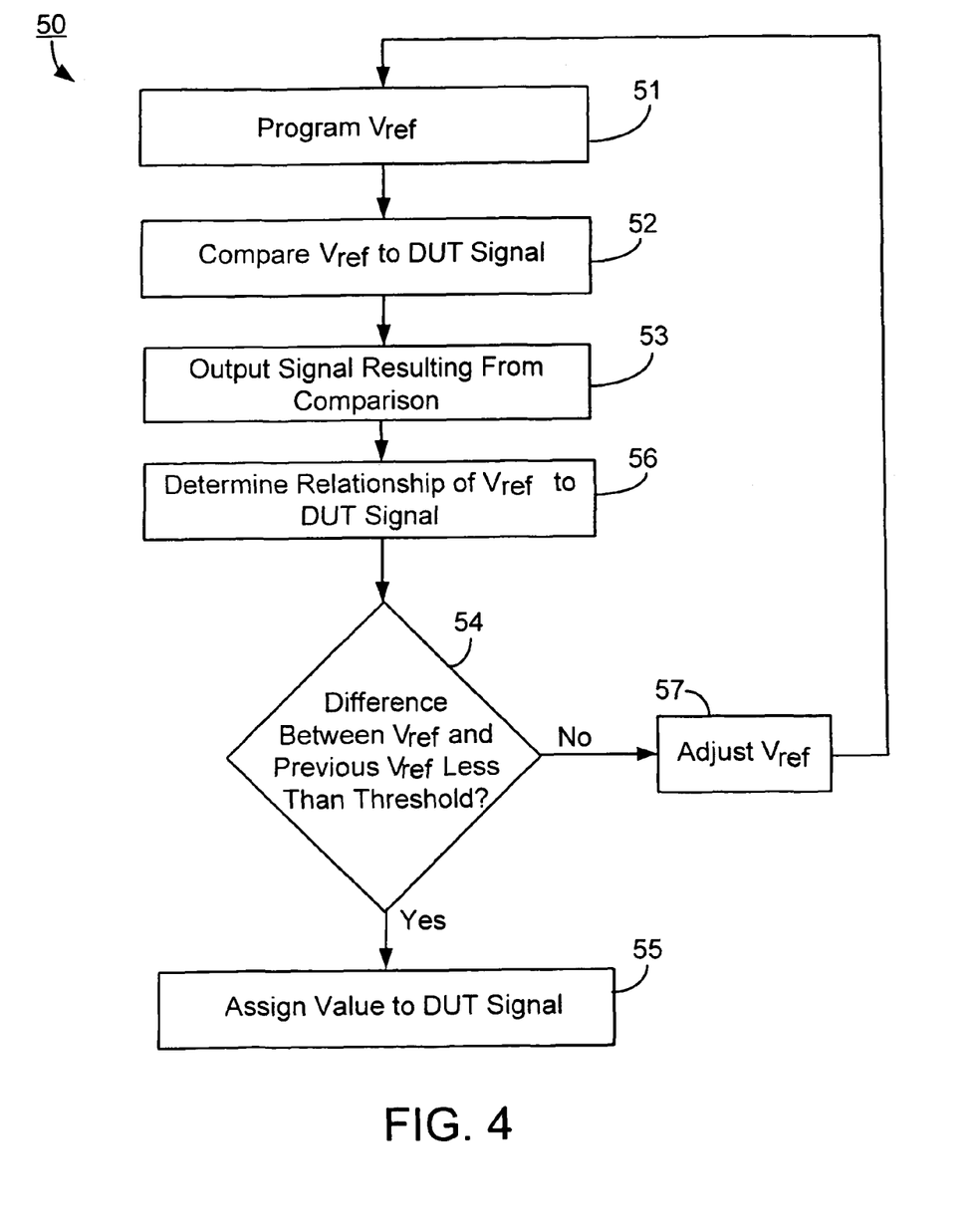
FIG. 4 is a flowchart showing a binary search process.

FIG. 4 shows a binary search process that may be performed using circuitry 40 of FIG. 3. Process 50 programs (51) DAC 45 to generate $V_{ref}$.

Process 50 compares (52) $V_{ref}$ to DUT signal 47. In this implementation, the comparison is performed using comparator 46. If $V_{ref}$ is greater than DUT signal 47, comparator 46 outputs (53) an indication, such as a high voltage signal. If $V_{ref}$ is less than DUT signal 47, comparator 46 outputs (53) a different indication, such as a low voltage signal. An output signal from comparator 46 is provided to logic 48.

Logic 48 determines (56), based on the output signal of comparator 46, whether DUT signal 47 is greater than, or less than, $V_{ref}$. Logic 48 outputs a signal to computer 42 indicating whether DUT signal 47 is greater than, or less than, $V_{ref}$.

Computer 42 determines (54) the difference between a current value of $V_{ref}$ and a previous value of $V_{ref}^-$. In this regard, process 50 may be repeated until the difference between a current value of $V_{ref}$ and a previous value of $V_{ref}^-$ is less than the predetermined amount. If this is the case, computer 42 assigns (55) a value corresponding to $V_{ref}$ to DUT signal 47. The value may be the actual value of $V_{ref}$ or it may be based on $V_{ref}$. For example, the value may be $V_{ref}$ plus or minus a predefined constant. Process 50 may be repeated for numerous DUT signals, and the resulting obtained values may be arranged chronologically and interpolated, if desired, to obtain a waveform output at a DUT pin.

If the difference between the current value of $V_{ref}$ and the previous value of $V_{ref}$ is greater than the predetermined amount (54), then process is repeated using a new, adjusted value for $V_{ref}$. In particular, if DUT signal 47 is less than $V_{ref}$, computer 42 adjusts (57) $V_{ref}$ by reprogramming DAC 45 to output a new reference voltage $V_{ref}$, which has a value equivalent to $V_{ref}$ less a specified amount. If DUT signal 47 is greater than $V_{ref}$, computer 42 adjusts (57) $V_{ref}$ by reprogramming DAC 45 to output a new reference voltage $V_{ref}$, which has a value equivalent to $V_{ref}$ plus a specified amount.

Instead of implementing process 50 using circuitry 40, process 50 may be implemented in software. An example of a machine-executable computer code to implement process 50 is shown in attached Appendix B.

Figure 5:
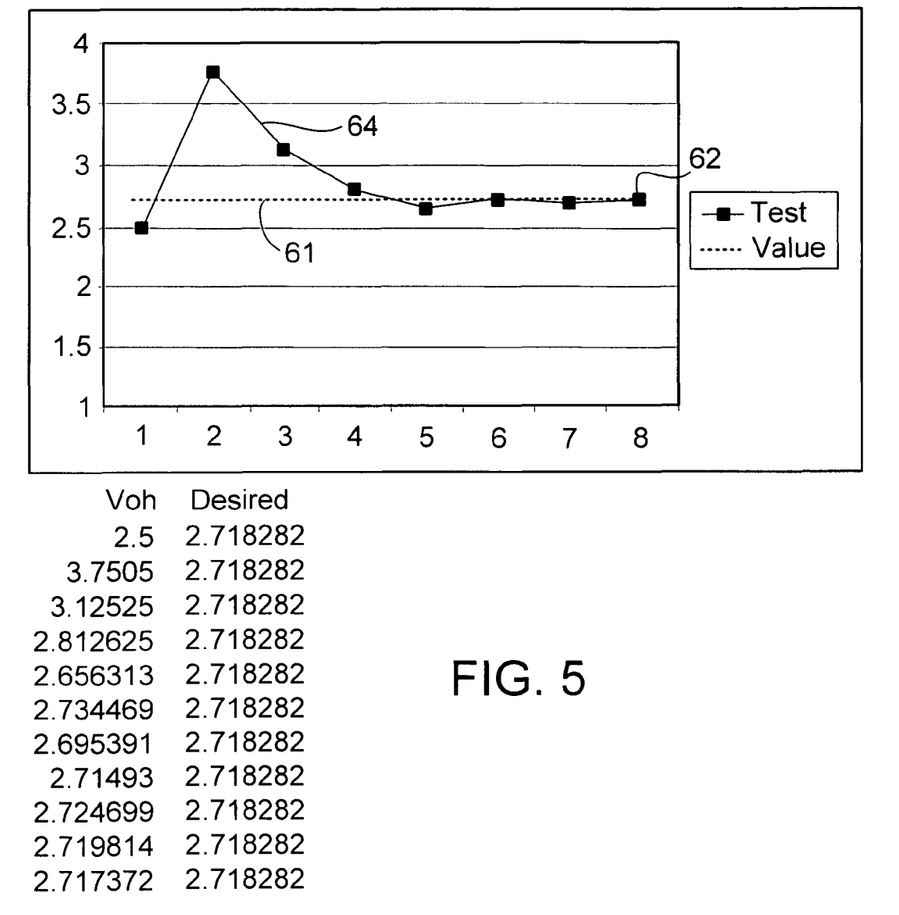
FIG. 5 is a graph showing the number of iterations required to obtain a device signal value using a binary search process.

FIG. 5 shows the number of iterations required to obtain a DUT signal value using binary search process 50. As shown in FIG. 5, binary search process 50 requires eight iterations to obtain the DUT signal value. Line 61 corresponds to the value. Points 62 represent values of $V_{ref}$, and curve 64 is an interpolation of those values. The table accompanying FIG. 5 includes a desired value and values of $V_{oh}$ at each iteration.

Figure 6:
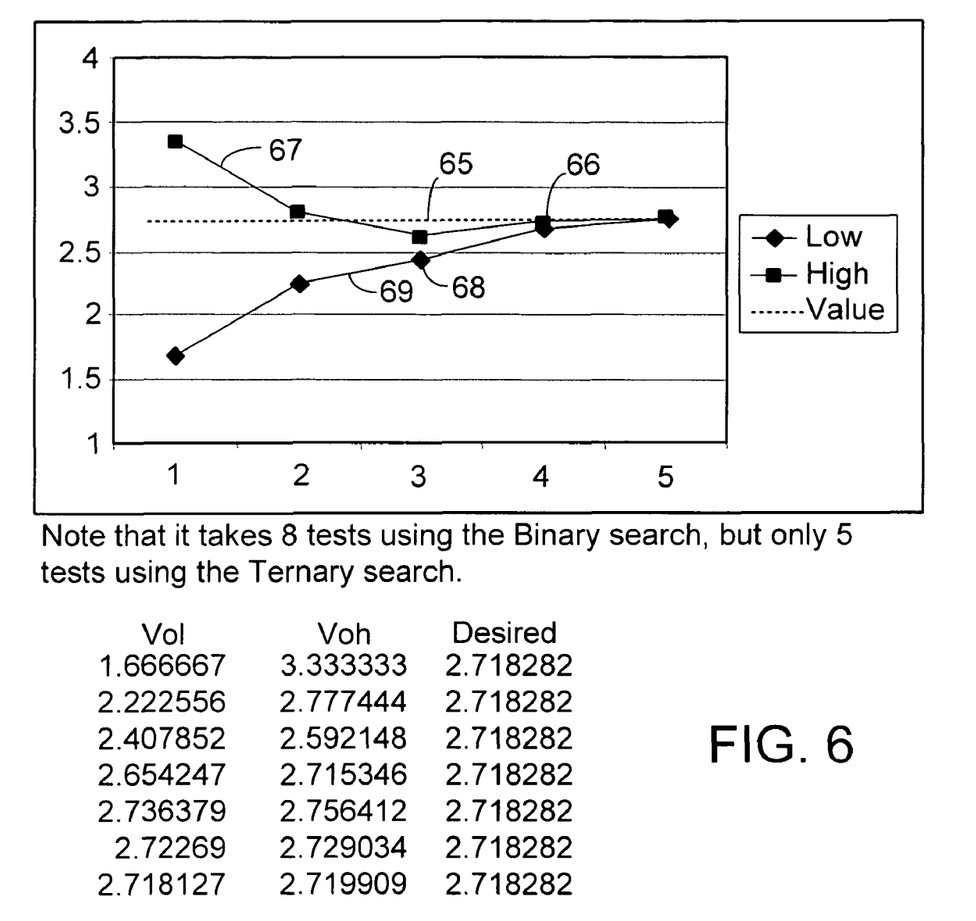
FIG. 6 is a graph showing the number of iterations required to obtain a device signal value using a ternary search process.

FIG. 6 shows the number of iterations required to obtain a DUT signal value using ternary search process 30. As shown in FIG. 6, ternary search process 30 requires five iterations to obtain the DUT signal value. Line 65 corresponds to the value. Points 66 represent values of $V_{oh}$, and curve 67 is an interpolation of those values. Points 68 represent values of $V_{ol}$, and curve 69 is an interpolation of those values. The table accompanying FIG. 6 includes a desired value and values of $V_{ol}$ and $V_{oh}$ at each iteration.

As is evident, ternary searching obtains the DUT signal value using fewer iterations than binary searching. If hardware is used to perform ternary searching, operational differences between the comparators (e.g., comparators 19 and 20 of FIG. 1) can result in errors, particularly when the difference between $V_{ol}$ and $V_{oh}$ is small (e.g., 1 mV). It is noted that this is typically not a problem in pure software implementations.

One way of reducing such errors is to combine ternary search process 30 and binary search process 50 to obtain a DUT signal value. That is, ternary searching may be used when the difference between $V_{ol}$ and $V_{oh}$ is relatively large, e.g., in the first several iterations of a search. When the difference between $V_{ol}$ and $V_{oh}$ is less than a set threshold, then binary searching may be used to complete the search and obtain the DUT signal value.

One way of implementing such combined ternary and binary searching is to perform ternary search process 30, and to have logic 21 disable, e.g., comparator 20 when the difference between $V_{ol}$ and $V_{oh}$ is less than a predetermined threshold. Thereafter, the DAC associated with comparator 19 is programmed to output a $V_{ref}$ value, and processing proceeds in accordance with binary search process 50.

Figure 7:
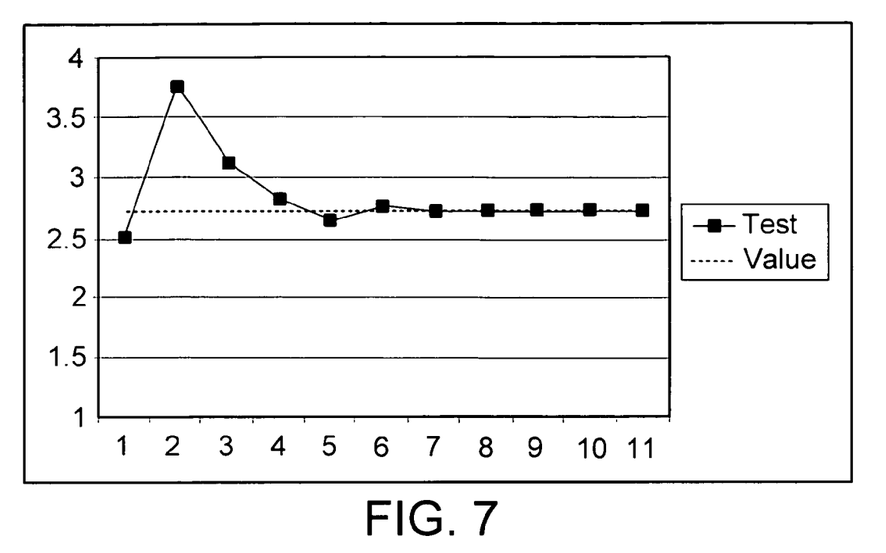
FIG. 7 is a graph showing the number of iterations required to obtain a device signal value using a binary search process having a 1 mV resolution.
Figure 8:
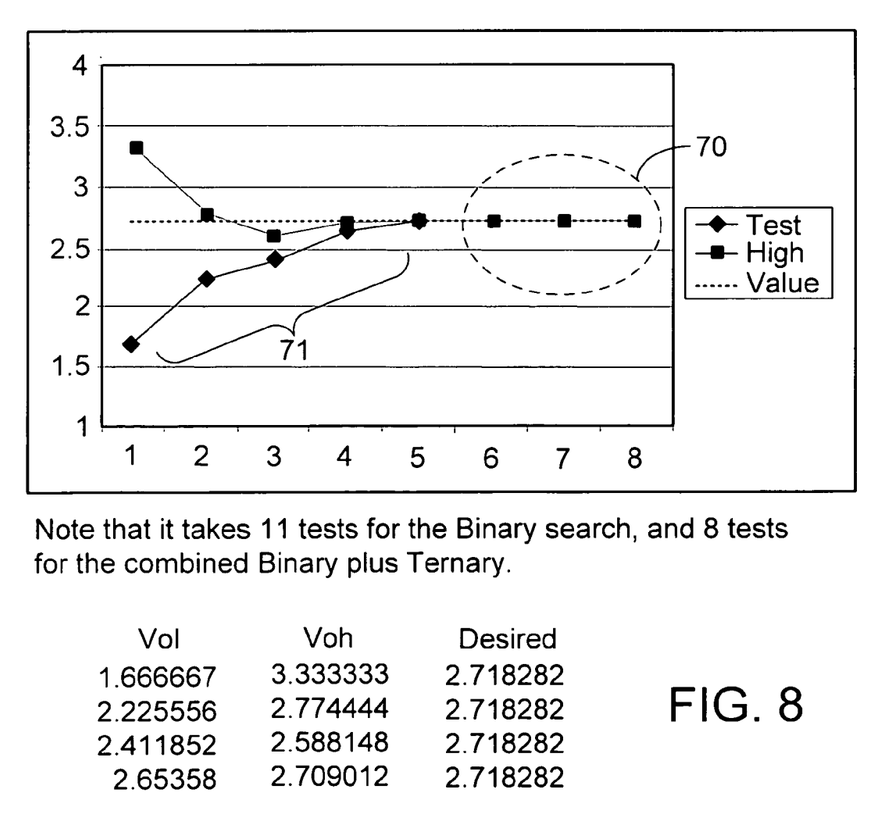
FIG. 8 is a graph showing the number of iterations required to obtain a device signal value using a combined ternary and binary search process having a 1 mV resolution.

FIG. 7 shows the results of a pure binary search process having a 1 mV resolution, meaning that the threshold for detecting a DUT signal value is 1 mV. As shown in FIG. 7, it takes eleven iterations to obtain a DUT signal value using pure binary searching. FIG. 8 shows the results of a combined ternary and binary search process, which also has a 1 mV resolution. The first five iterations 71 are performed using ternary search process 30. The remaining three iterations 70 are performed using binary search process 50. Using combined binary and ternary searching, the DUT signal value is obtained using eight iterations, which is an improvement over pure binary searching. The table accompanying FIG. 8 includes a desired value and values of $V_{ol}$ and $V_{oh}$ at each iteration.

The search processes, namely ternary search process 30, binary search process 50, and the combined ternary and binary search process described above, are not limited to use with the hardware and software described above. The search processes can be implemented in any digital and/or analog electronic circuitry, computer hardware, firmware, software, and/or combinations thereof.

The search processes can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Actions associated with implementing the search processes can be performed by one or more programmable processors executing one or more computer programs to perform the functions of the search processes. All or part of the search processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Elements of different embodiments described herein may be combined to form other embodiments not specifically set forth above. The actions performed during the search processes may be reordered to obtain the same, or similar, results. Other embodiments not specifically described herein are also within the scope of the following claims.

Appendix A

```
'Ternary searching
Sub Test 3 (desired As Double, lower As Double, upper As
    Double, resolution As Double)
Dim TestLow As Double, TestHigh As Double
Dim LastLow As Double, LastHigh As Double
Dim row As Integer
'assumed: upper >lower, resolution <(upper-lower)
    Worksheets("Base 3 ").Activate
    ActiveSheet.UsedRange.Clear
    row=1
While (upper-lower) >resolution
'Segment the test region, compare to desired.
    TestLow=(upper-lower) * 1/3+lower
    TestHigh=(upper-lower) * 2/3+lower
    ActiveSheet.Cells(row, 1 )=TestLow
    ActiveSheet.Cells(row, 2 )=TestHigh
    ActiveSheet.Cells(row, 3 )=desired
    row=row +1
    LastLow=TestLow
    LastHigh=TestHigh
'on a tester, one would write and read hardware here.
    If desired <TestLow Then
        upper =TestLow−resolution
    ElseIf(TestLow    <=desired)And    (desired<=TestHigh)
    Then
        upper=TestHigh−resolution
        lower=TestLow=resloution
    Else'must be above high.
        lower=TestHigh+resolution
    End If
Wend
'now add a final binary search
    Test 2desired, LastLow,LastHigh,resolution/10, row
End Sub
```

Appendix B

```
'base 2searching
Sub Test 2(desired As Double, lower As Double, upper As
    Double, resolution As Double, _
Optional row As Integar=1)
Dim test As Double
If row=1 Then
    Worksheets("Base 2").Activate
    ActiveSheet.UsedRange.Clear
End If
While (upper−lower)>resolution
'Segment the test region, compare to desired.
    test=(upper−lower)/ 2+lower
    ActiveSheet.Cells(row, 2)=test
    ActiveSheet.Cells(row, 3)=desired
    row=row +1
'on a tester, one would write and read hardware here.
    If desired <test Then
```

```
    upper =test –resolution
Else 'must be above high.
    lower=test +resolution
End If
Wend
End Sub
```

What is claimed is:

1. An apparatus for use in obtaining a value from a device, comprising:
   a first comparator to receive a reference high signal and a device signal, the first comparator providing a first output signal to indicate whether the device signal is above or below the reference high signal;
   a second comparator to receive a reference low signal and the device signal, the second comparator providing a second output signal to indicate whether the device signal is above or below the reference low signal; and
   circuitry (i) to adjust at least one of the reference high signal and the reference low signal based on the first output signal and the second output signal, wherein the at least one of the reference high signal and the reference low signal are adjusted to make the reference high signal and the reference low signal converge relative to prior values of the reference high signal and the reference low signal, and (ii) to output the value if a difference between the reference high signal and the reference low signal meets a predetermined criterion, the value being based on the difference.

2. The apparatus of claim 1, wherein the circuitry is configured to determine, based on the first output signal and the second output signal, whether the device signal is above the reference high signal, below the reference low signal, or between the reference high signal and the reference low signal.

3. The apparatus of claim 2, wherein the reference high signal is at a set voltage level and, if the device signal is above the reference high signal, the circuitry is configured to adjust the reference low signal so that the reference low signal is at the set voltage level and so that the reference high signal exceeds the set voltage level.

4. The apparatus of claim 2, wherein the reference low signal is at a set voltage level and, if the device signal is below the reference low signal, the circuitry is configured to adjust the reference high signal so that the reference high signal is at the set voltage level and so that the reference low signal is below the set voltage level.

5. The apparatus of claim 2, wherein, the reference high signal is at a first set voltage and the reference low signal is at a second set voltage and, if the device signal is between the reference high signal and the reference low signal, the circuitry is configured to adjust the reference high signal or the reference low signal to be between the first set voltage and the second set voltage.

6. The apparatus of claim 1, wherein, (i) if the value is not output, and (ii) after the reference high signal and/or the reference low signal are adjusted:
   the first comparator is configured to receive the reference high signal and the device signal, the first comparator being configured to provide a third output signal to indicate whether the device signal is above or below the reference high signal;
   the second comparator is configured to receive the reference low signal and the device signal, the second comparator being configured to provide a fourth output signal to indicate whether the device signal is above or below the reference low signal; and
   the circuitry (i) is configured to adjust at least one of the reference high signal and the reference low signal based on the third output signal and the fourth output signal, and (ii) is configured to output the value if a difference between the reference high signal and the reference low signal meets the predetermined criterion.

7. The apparatus of claim 1, wherein the circuitry is configured to determine if the difference is below a predetermined threshold and, if the difference is below the predetermined threshold, the circuitry being configured to deactivate the first comparator or the second comparator, where a comparator that is not deactivated is an active comparator.

8. The apparatus of claim 7, wherein:
   the active comparator is configured to receive a reference signal and the device signal, the active comparator being configured to provide a third output signal to indicate whether the device signal is above or below the reference signal; and
   the circuitry is configured to adjust the reference signal based on the third output signal, and (ii) to output the value if a difference between the reference high signal and a previous reference signal meets the predetermined criterion, the value being based on the difference.

9. The apparatus of claim 1, wherein the at least one of the reference high signal and the reference low signal are adjusted so that the reference high signal and the reference low signal converge over more than two successive values.

10. A method for obtaining a value from a device signal, comprising:
    performing a ternary search process in an attempt to obtain the value from the device signal, the ternary search process comprising comparing the device signal to both a reference high signal and a reference low signal; and
    repeating the ternary search process, wherein each time the ternary search process is repeated, the ternary search process gets closer to obtaining the value by adjusting at least one of the reference high signal and the reference low signal, wherein the at least one of the reference high signal and the reference low signal are adjusted to make the reference high signal and the reference low signal converge relative to prior values of the reference high signal and the reference low signal.

11. The method of claim 10, wherein performing the ternary search process comprises:
    comparing the device signal to the reference high signal;
    comparing the device signal to a reference low signal; and
    determining whether a difference between the reference high signal and the reference low signal meets a predetermined criterion,
    wherein, if the difference meets the predetermined criterion, the ternary search process further comprises:
        outputting the value, the value being based on the difference; and
    wherein, if the difference does not meet the predetermined criterion, the ternary search process further comprises:
        determining whether the device signal is above the reference high signal, between the reference high signal and the reference low signal, or below the reference low signal; and
        adjusting at least one of the reference high signal and the reference low signal based on whether the device signal is above the reference high signal, between the reference high signal and the reference low signal, or below the reference low signal.

12. The method of claim 11, wherein:
    if the device signal is above the reference high signal, the reference low signal is adjusted so that the reference low signal is at a set voltage level and so that the reference high signal exceeds the set voltage level;

if the device signal is below the reference low signal, the reference high signal is adjusted so that the reference high signal is at the set voltage level and so that the reference low signal is below the set voltage level; and if the device signal is between the reference high signal and the reference low signal, the reference high signal or the reference low signal is adjusted to be between the first set voltage and the second set voltage.

13. The method of claim 10, wherein the ternary search process is repeated until a difference between the reference high signal and the reference low signal is less than a predetermined threshold and, thereafter, the method comprises performing a binary search process until the value is obtained.

14. The method of claim 13, wherein the binary search process comprises:

comparing the device signal to a reference signal;

determining whether the device signal is above or below the reference high signal; and adjusting the reference signal based on whether the device signal is above or below the reference signal.

15. The method of claim 10, wherein the ternary search process is repeated until the value is obtained.

16. The method of claim 10, wherein the at least one of the reference high signal and the reference low signal are adjusted so that the reference high signal and the reference low signal converge over more than two successive values.

17. A machine-readable medium that stores executable instructions for use in obtaining a value from a device signal, the instructions for causing a machine to:

perform a ternary search process in an attempt to obtain the value from the device signal, the ternary search process comprising comparing the device signal to both a reference high signal and a reference low signal; and repeat the ternary search process, wherein each time the ternary search process is repeated, the ternary search process gets closer to obtaining the value by adjusting at least one of the reference high signal and the reference low signal, wherein the at least one of the reference high signal and the reference low signal are adjusted to make the reference high signal and the reference low signal converge relative to prior values of the reference high signal and the reference low signal.

18. The machine-readable medium of claim 17, wherein performing the ternary search process comprises:

comparing the device signal to the reference high signal;

comparing the device signal to a reference low signal; and determining whether a difference between the reference high signal and the reference low signal meets a predetermined criterion, wherein, if the difference meets the predetermined criterion, the ternary search process further comprises:

outputting the value, the value being based on the difference; and wherein, if the difference does not meet the predetermined criterion, the ternary search process further comprises:

determining whether the device signal is above the reference high signal, between the reference high signal and the reference low signal, or below the reference low signal; and adjusting at least one of the reference high signal and the reference low signal based on whether the device signal is above the reference high signal, between the reference high signal and the reference low signal, or below the reference low signal.

19. The machine-readable medium of claim 18, wherein:

if the device signal is above the reference high signal, the reference low signal is adjusted so that the reference low signal is at a set voltage level and so that the reference high signal exceeds the set voltage level;

if the device signal is below the reference low signal, the reference high signal is adjusted so that the reference high signal is at the set voltage level and so that the reference low signal is below the set voltage level; and if the device signal is between the reference high signal and the reference low signal, the reference high signal or the reference low signal is adjusted to be between the first set voltage and the second set voltage.

20. The machine-readable medium of claim 17, wherein the ternary search process is repeated until a difference between the reference high signal and the reference low signal is less than a predetermined threshold and, thereafter, the machine-readable medium comprises performing a binary search process until the value is obtained.

21. The machine-readable medium of claim 20, wherein the binary search process comprises:

comparing the device signal to a reference signal;

determining whether the device signal is above or below the reference high signal; and adjusting the reference signal based on whether the device signal is above or below the reference signal.

22. The machine-readable medium of claim 17, wherein the ternary search process is repeated until the value is obtained.

23. The machine-readable medium of claim 17, wherein the at least one of the reference high signal and the reference low signal are adjusted so that the reference high signal and the reference low signal converge over more than two successive values.

* * * * *